US007020820B2

(12) United States Patent
Caty et al.

(10) Patent No.: US 7,020,820 B2
(45) Date of Patent: Mar. 28, 2006

(54) INSTRUCTION-BASED BUILT-IN SELF-TEST (BIST) OF EXTERNAL MEMORY

(75) Inventors: Olivier Caty, San Jose, CA (US); Ismet Bayraktaroglu, Sunnyvale, CA (US); Amitava Majumdar, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 383 days.

(21) Appl. No.: 10/326,630

(22) Filed: Dec. 20, 2002

(65) Prior Publication Data
US 2004/0123200 A1   Jun. 24, 2004

(51) Int. Cl.
  *G01R 31/28*   (2006.01)
  *G06F 11/00*   (2006.01)
(52) U.S. Cl. ..................... 714/733; 714/717; 714/46
(58) Field of Classification Search ................ 714/733, 714/734, 738, 743, 736, 718, 819, 42, 48, 714/54
See application file for complete search history.

(56) References Cited

U.S. PATENT DOCUMENTS

| 3,783,254 | A |   | 1/1974  | Eichelberger ............... 235/152 |
| 5,173,906 | A |   | 12/1992 | Dreibelbis et al. ........ 371/25.5 |
| 5,675,545 | A | * | 10/1997 | Madhavan et al. ......... 365/201 |
| 6,067,262 | A | * | 5/2000  | Irrinki et al. ............... 365/201 |
| 6,088,823 | A | * | 7/2000  | Ayres et al. ................ 714/733 |
| 6,760,865 | B1| * | 7/2004  | Ledford et al. .............. 714/30 |

OTHER PUBLICATIONS

"What Is Built-In Self Test And Why Do We Need It?", Richard L. Campbell, EE-Evaluation Engineering, Mar. 1996.
"What is Embedded Test?", http://www.logicvision.com/embedded/index.html.
"A Programmable BIST Core for Embedded DRAM", Huang, et al. National Tsing Hua University, Jan.-Mar. 1999.
"Processor-Based Built-In Self-Test for Embedded DRAM" Dreibelbis, et al. IEEE Journal of Solid-State Circuits, vol. 33, No. 11, Nov. 1998.
IEEE Standard Test Access Port and Boundary-Scan Architecture, IEEE Std 1149.1-2001 (Revision of IEEE Std 1149-.1-1990), pp. i-vii 1-200 (Jun. 14, 2001).

* cited by examiner

*Primary Examiner*—Christine T. Tu
(74) *Attorney, Agent, or Firm*—Blakely, Sokoloff, Taylor & Zafman LLP

(57) ABSTRACT

Disclosed are novel methods and apparatus for efficiently providing instruction-based BIST of external memory. In an embodiment, a built-in self-testing system is disclosed. The system includes an external memory module, an on-chip memory controller coupled to the external memory module, an on-chip built-in self-test (BIST) module coupled to the on-chip memory controller, and an interface controller coupled to the BIST module to provide an interface to access the BIST module. The on-chip memory controller may send and receive data to and from the external memory module. And, the BIST module may include an instruction register to store a plurality of instructions.

23 Claims, 2 Drawing Sheets

INSTRUCTION-BASED BUILT-IN SELF-TEST (BIST) OF EXTERNAL MEMORY

FIELD OF INVENTION

The present invention generally relates to the field of circuit testing. More specifically, an embodiment of the present invention provides instruction-based built-in-self-test (BIST) of external memory.

BACKGROUND OF INVENTION

As the complexity of integrated circuits (ICs) increases and access to their internal circuit nodes becomes harder, properly testing such devices becomes a major bottleneck during their prototyping, development, production, and maintenance. As a result, designs with BIST implementation have become commonplace. In a BIST implementation, circuitry (which is intended solely to support testing) is included in an IC or in a system including ICs.

With 64-bit support in the latest generation of microprocessor families, it is customary to find large (e.g., up to 40 GB) external memories. Although the memory provider normally guarantees a reasonably high level of test coverage before shipping the memory chips to their customers, it is common to find defects in the memory chips after they are mounted on boards or modules. As a result, some memory tests need to be done on the system to detect defects that either remained undetected due to gaps in the manufacturer's test process or were introduced during the board or module manufacturing process.

Current board and system test strategies often rely on standard "invasive" test techniques involving either "Bed of Nails" or OBN type probing, or a "Hot Mock Up" type interconnection technique. These different methods of testing enables the physical "stitching" together of a system to allow booting to the local operating system (OS) or test kernel. Once the system has booted, diagnostic testing can proceed. However, with the escalation of board operating frequencies and bus speeds at the connectors (sometimes reaching 150 MHz and beyond), the "stitching" introduces signal integrity or timing issues that render these techniques often unreliable or non-repeatable. This fundamental problem results in higher test costs due to higher manufacturing retest rates, higher no-trouble found (NTF) rates, and/or higher test capital consumption.

A solution can be using power-on self-test (POST). However, an important prerequisite for using POST is a functional and reliable central processing unit (CPU) and a programmable read-only memory (PROM) boot path. To fulfill this requirement, the functionality and integrity of several parts of the chip or module (such as PROM, bus interface, peripheral component interface (PCI) bus) has to be assured first. This, in turn, requires a significant investment in expensive test hardware and test fixture capital.

Furthermore, while POST can be utilized as a board system level test feature, any enhancement to POST requires significant development time and cost. This, along with the fact that POST development requires a "golden" board as a precondition, makes it logistically difficult to rely completely on POST enhancements to cover memory test and diagnosis. Consequently, the test infrastructure (test host, instrumentation, fixtures, etc.) costs have quadrupled from last generation to the current generation of product testing. This increase in test costs has necessitated some fundamental changes in testing strategies for external memories and other board or system level components. This change has mainly been in the form of an increased reliance on embedded and structured test methodologies that are independent of the OS and require only a minimal set of system level resources (power, clocks, and the Institute of Electrical and Electronics Engineers (IEEE) 1149.1 standard interface)) to be functional.

External memory BIST (EBIST) is one such methodology. Not having to boot to a local OS relieves the requirement of having to "stitch" together a system with costly or unreliable invasive probing or interconnection techniques. Memory BIST is used today in the industry for testing embedded memories (such as that available commercially from LogicVision of San Jose, Calif.). Such solutions are generally based on hard-coding a predefined test algorithm and data patterns. Another approach is based on multiplexing EBIST logic into the memory bus input/outputs (IOs), thus bypassing all internal logic. With advances in technology and processes, and a wide range of available memory designs, however, there is an increasing need for more flexibility in the kind of test algorithms and the test patterns.

To address this issue, one proposed approach is to implement a processor-based engine with two separate instruction storage memories. This approach offers a fair degree of flexibility but suffers from high area overhead. Another proposed approach is implementing an EBIST that reduces area overhead by coding BIST features into register transfer level (RTL). However, this approach results in less flexibility of test algorithms and may not be applicable to many memory chips available on the market today. Some of the issues with past EBIST techniques can be summarized as follows: (a) they require intrusion at a chip's IOs, which are usually in the critical paths, resulting in timing problems and design iterations to accommodate EBIST; (b) they require reimplementing the random access memory (RAM) access protocol inside the BIST engine, resulting in unnecessary area overhead (not to mention the risk of implementing and, hence, testing an incorrect protocol); and/or (c) they generally hardcode the test algorithm, the data background, and/or both, resulting in low test coverage of the memory subsystem and not providing the flexibility required for diagnosis or for targeting memories from different vendors.

SUMMARY OF INVENTION

The present invention includes novel methods and apparatus to efficiently provide instruction-based BIST of external memory. In an embodiment, a built-in self-testing system is disclosed. The system includes an external memory module, an on-chip memory controller coupled to the external memory module, an on-chip built-in self-test (BIST) module coupled to the on-chip memory controller, and an interface controller coupled to the BIST module to provide an interface to access the BIST module. The on-chip memory controller may send and receive data to and from the external memory module. And, the BIST module may include an instruction register to store a plurality of instructions.

In another embodiment, the BIST module may utilize the on-chip memory controller to perform tests on the external memory module.

In a further embodiment, the interface controller may include a test access port (TAP) (such as that provided by the IEEE 1149.1 standard).

In yet a further embodiment, the system may further include an I/O interface coupled between the on-chip memory controller and the external memory module to provide communication between the on-chip memory controller and the external memory module.

In a different embodiment, the instruction register may include at least six 7-bit registers.

In yet another embodiment, the instructions may have an opcode selected from a group comprising March element, inversion, increment/decrement address, and/or address uniqueness.

BRIEF DESCRIPTION OF DRAWINGS

The present invention may be better understood and its numerous objects, features, and advantages made apparent to those skilled in the art by reference to the accompanying drawings in which.

The use of the same reference symbols in different drawings indicates similar or identical items.

DETAILED DESCRIPTION

In the following description, numerous details are set forth. It will be apparent, however, to one skilled in the art that embodiments of the invention may be practiced without these specific details. In other instances, well-known structures, devices, and techniques have not been shown in detail, in order to avoid obscuring the understanding of the description. The description is thus to be regarded as illustrative instead of limiting.

Reference in the specification to "one embodiment" or "an embodiment" means that a particular feature, structure, or characteristic described in connection with the embodiment is included in at least an embodiment of the invention. The appearances of the phrase "in one embodiment" in various places in the specification are not necessarily all referring to the same embodiment.

To provide access to BIST functionality on a chip, a TAP may be utilized. TAP can be a general-purpose port that provides access to test support functions built into a component. Further information on by IEEE 1149.1 standard interface may be found in IEEE Standard Test Access Port and Boundary-Scan Architecture, IEEE Std 1149.1-1990 (includes IEEE Std 1149.1a-1993), Chapter 3, entitled "The Test Access Port," which is hereby incorporated herein for all purposes.

Figure 1:
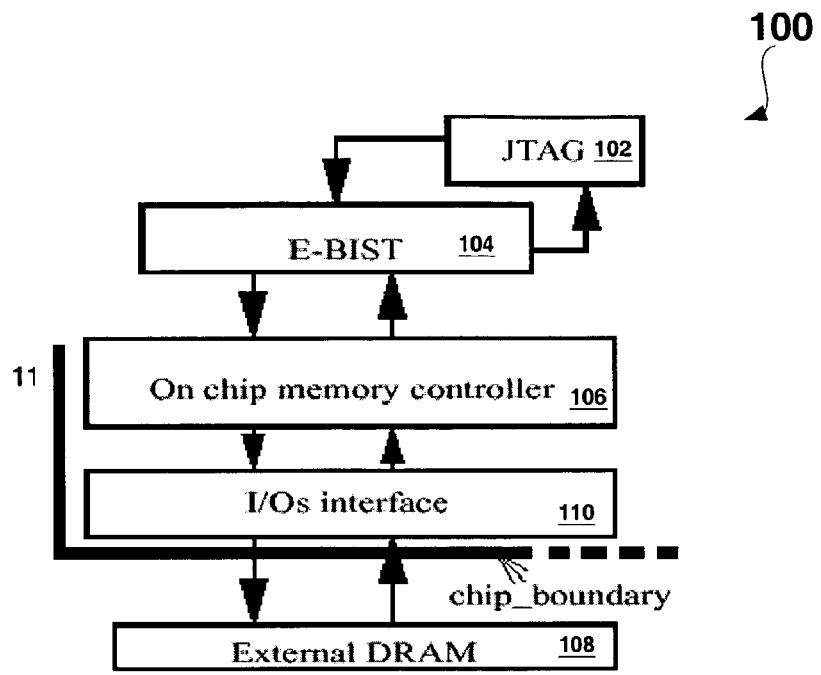
FIG. 1 illustrates an exemplary high-level EBIST system 100 in accordance with an embodiment of the present invention.

FIG. 1 illustrates an exemplary high-level EBIST system 100 in accordance with an embodiment of the present invention. A standard IEEE 1149.1 standard interface controller 102 may be used to program an EBIST engine 104 through, for example, a serial link synchronized to the internal core clock. In an embodiment, it is envisioned that other types of links may be utilized to program the EBIST engine 104 such as Ethernet, Fast Ethernet, wireless, modem, cellular, universal serial bus (USB and its varieties such as USB II), and/or FireWire. In one embodiment, the EBIST engine 104 may be implemented inside a CPU. The CPU may be a SPARC microprocessor available from several vendors (including Sun Microsystems of Santa Clara, Calif.). Those with ordinary skill in the art understand, however, that any type of a CPU may be utilized to embody the present invention, including those made by Hewlett Packard of Palo Alto, Calif., and IBM-compatible personal computers utilizing Intel microprocessor, which are available from several vendors (including IBM of Armonk, N.Y.). In addition, instead of a single processor, two or more processors (whether on a single chip or on separate chips) can be utilized. It is further envisioned that the CPU may be a complex instruction set computer (CISC) microprocessor, a reduced instruction set computing (RISC) microprocessor, a very long instruction word (VLIW) microprocessor, a processor implementing a combination of instruction sets, and the like.

In the EBIST system 100, the EBIST engine 104 may, in turn, use an on-chip memory controller 106 to access an external memory 108 through, for example, an I/O interface 110. In FIG. 1, a boundary of the chip that the BIST engine 104 resides on is shown as item 112. In an embodiment, the BIST engine 104 may be compatible with the interface protocol of memory controller 106. The BIST engine 104 may generate four sets of signals (e.g., address, data, read/write controls, and service requests) to talk to the memory controller 106. The BIST engine 104 may also decode the requests from the memory controller 106 to the external memory 108 in order to predict expected values from the external memory 108. Such an embodiment is envisioned to permit implementation of the EBIST with little area overhead, in part, by reusing existing on-chip features for memory access. Additionally, there would be no need to reimplement the memory access protocol.

In a further embodiment, the features of the EBIST system 100 may include any combination of the following:

The IEEE 1149.1 standard interface 102 may reduce pin requirements for accessing the EBIST engine 104 down to the five existing IEEE 1149.1 standard interface pins. This, along with in-flight programming (i.e., being programmable while the clock is running at full frequency, e.g., when the associated phase-locked loop (PLL) is in lock, to allow debugging of complex, intermittent failures) means that the transfer of data from the IEEE 1149.1 standard interface 102 to the EBIST engine 104 may need to be synchronized to the internal (i.e., faster) core clock.

The EBIST system 100 may provide for a highly flexible and programmable test algorithm. There can be six instruction registers that allow the user to program the test algorithm. It is envisioned, however, that the number of instructions may be reduced or extended in various embodiments. In one embodiment, the EBIST engine 104 may implement three basic March elements (e.g., read, write, and read-write-read) that can be sequenced in a number of ways, based on the six instruction registers, for example. This allows the user to define several different test algorithms from a simple 2N and up to xN (where x=3* number of instruction registers, for example). For example, a 2N test may involve writing data to all address locations, reading back, and comparing the data with the expected value. Moreover, a 13N may involve the following:

Address (0) -> Address (max) write X (i.e., writing X to Address (0) through Address (max));
Address (0) -> Address (max) read X, write Y, read Y (where Y is the inverted value of X);
Address (0) -> Address (max) read Y, write X, read X;

-continued

Address (Max) -> Address (0) read X, write Y, read Y; and
Address (Max) -> Address (0) read y, write X, read X.

The EBIST engine 104 may also provide a prepackaged address uniqueness test where the address ranges can be programmed through the IEEE 1149.1 standard interface 102. Furthermore, the address uniqueness may be implemented as a mod of operation (such as 2N, 3N, and the like). Accordingly, the programming of the address range may be done independently of the mode of operation.

The EBIST engine 104 may implement true checkerboard pattern testing by, for example, allowing consecutive addresses to write inversions of the programmed data background.

In one embodiment, a loop option may let the EBIST engine 104 to iterate the programmed sequence of March elements. This may allow the user to better distinguish between intermittent and permanent failures in a board or system environment. This approach can also be used during burn-in for controlling the amount of stress the device under test (DUT) should be put through.

The range of addresses to be tested may be programmable using a start and end address.

The EBIST engine 104 may also provide a programmable address step size to allow quick screening of large memories without going through the complete address space, thus reducing test times in production as well as reducing verification times.

The data backgrounds for testing memories may also be programmable. This fulfils requirements associated with high coverage memory tests that are independent of address and data scrambling.

An error counter in the BIST engine may keep track of the number of errors detected during a test session. This feature may be especially useful in debug.

The BIST engine 104 may also allow the user to stop BIST on the Nth failure where N is programmable to any number such as below 256. This may further assist in debugging memory failures.

A second stop option that allows the user to stop BIST at a predefined address also helps in debugging. The stop address may be programmable.

Figure 2:
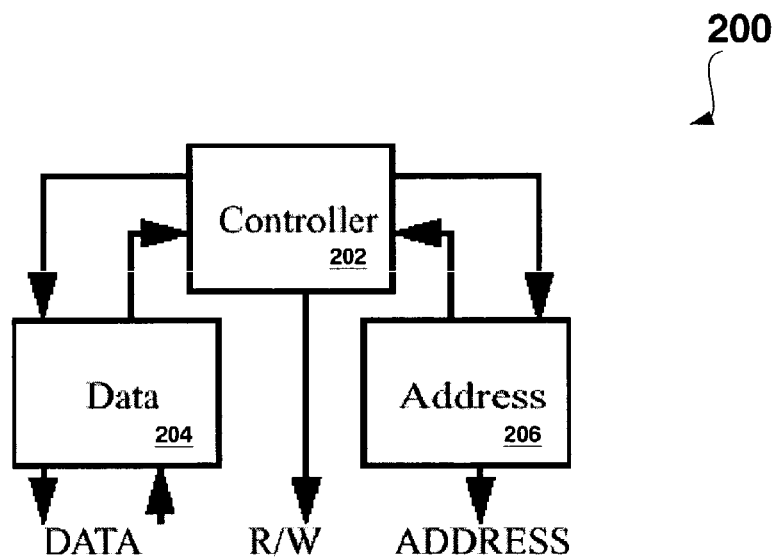
FIG. 2 illustrates an exemplary block diagram for an EBIST engine 200 in accordance with an embodiment of the present invention.

FIG. 2 illustrates an exemplary block diagram for an EBIST engine 200 in accordance with an embodiment of the present invention. In one embodiment, the EBIST 104 of FIG. 1 may be implemented as shown in FIG. 2. As shown, the EBIST engine 200 may be partitioned into three blocks: (1) an EBIST controller 202; (2) an EBIST data block 204; and/or (3) an EBIST address block 206. It is envisioned that other partitioning may be utilized in various embodiments to provide the EBIST engine 200.

In an embodiment, the EBIST controller 202 can include an EBIST instruction register, an EBIST instruction decoder, and/or other logic to provide, for example, flexibility to the user for defining system level tests. In one embodiment, the EBIST controller 202 may start upon receiving a reset signal and an EBIST mode selection signal. The EBIST controller 202 may in turn send control signals to a data generator (such as the EBIST data block 204), an address generator (such as the EBIST address block 206), and/or an output evaluator (for example, to test the output signals against a known value). Programming of the EBIST controller 202 may be done through an IEEE 1149.1 standard interface (such as that discussed with respect to FIG. 1) and may involve serially shifting in six instructions, a loop bit, and an address step-size through a test data in (TDI) such as those discussed in the IEEE Std 1149.1.

In a further embodiment, the instruction register may be a 6×7-bit register that can hold six 7-bit instructions. The instruction opcode may be divided into four fields as shown in Table 1 below.

TABLE 1

Fields in the EBIST Instruction

| Bit | Function |
|---|---|
| 0–1 | March Element |
| 2–4 | Inversion |
| 5 | Increment/Decrement Address |
| 6 | Address Uniqueness |

In an embodiment for March elements, bits 0 and 1 may be used to encode one of three March elements: 1. "01" for read; 2. "10" for write; and/or 3. "11" for read-write-read. The "00" code may be used to assert the done flag (e.g., indicating that an operation has finished). Using the six instructions, a sequence of six March elements can thus be defined. This allows defining March test algorithms whose complexity can vary between 2N and 18N.

In another embodiment, the three inversion bits (i.e., bits 2–4) may be used to specify whether the corresponding March element should use the inverted or non-inverted values of the data background. The function of the three bits may not be limited to just specify the data used for a March element. Instead, these three bits may be used for any combination of the following functions: (1) to define the inversion of the data used for each operation in a read-write-read March element; (2) the inversion bits can be used for forcing an error (this is very useful, for example, as a sanity check to test the EBIST circuitry itself before starting true tests); and/or (3) the same bits may also indicate whether the programmed data background is intended to be used, for example, as part of a checkerboard test where consecutive addresses need to use inverted data. With respect to item (3) above, the case for non-checkerboard tests may be different. In other words, these bits may allow the user to distinguish between a regular March test algorithm and a checkerboard test in an embodiment.

In one embodiment, bit 5 may indicate whether the address counter should increase or decrease through the address space. In another embodiment, bit 6 may be used to perform a special test on the external memory, referred to as the address uniqueness test. This test can check for address decoder faults that could map one address to many memory locations or many addresses to a single memory location. Bit 6 may override the data background as well as the inversion bits to allow for writing a unique bit vector to each location in the memory and/or read it back. Bit 6 also may override the operand bits by restricting the usage of the address uniqueness test to a single write and/or a single read.

Figure 3:
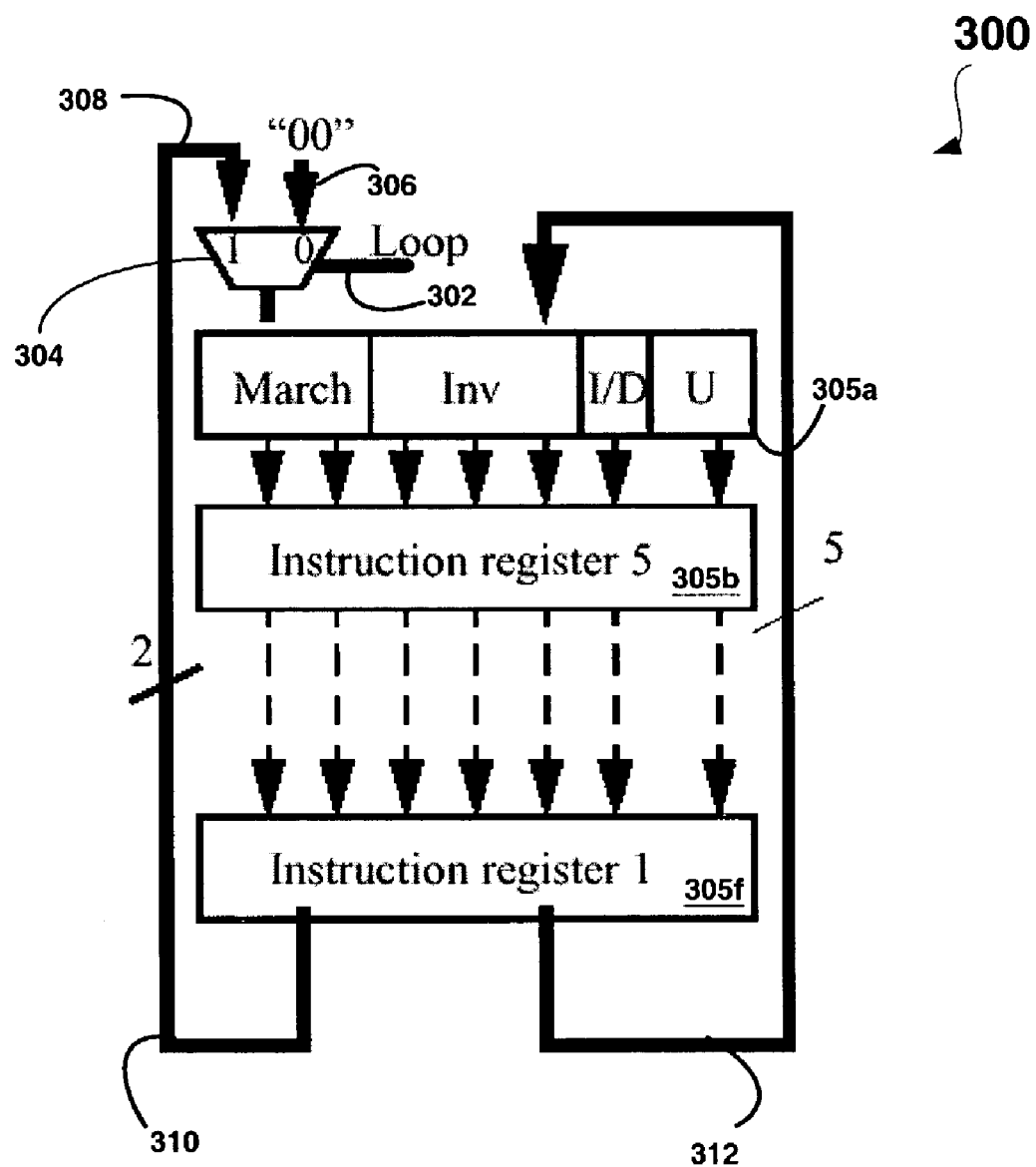
FIG. 3 illustrates an exemplary instruction register 300 in accordance with an embodiment of the present invention.

FIG. 3 illustrates an exemplary instruction register 300 in accordance with an embodiment of the present invention. The instruction register 300 of FIG. 3 illustrates a configuration in a loop mode as a circular first in, first out (FIFO) buffer. A loop signal 302 may select a loop mode for the instruction register 300, as illustrated in FIG. 3. The loop signal 302 may act as a select signal for a multiplexer 304.

The loop signal 302 may be provided by a loop register (not shown). In an embodiment, the loop register can be used to allow multiple iterations of the sequence of six March elements programmed through the six instructions discussed with respect to the Table 1. The loop register may be utilized as a high-level loop within which the loops, e.g., in each March element, may be nested. Such an embodiment may be utilized during board/system level debug to determine whether a detected failure is permanent and repeatable and/or is intermittent and dependent on environmental parameters, for example. The loop register may allow the user to run the same tests as many times as desired, for example, under varying environmental parameters, without having to restart the test every time.

In an embodiment, the instruction register 300 includes six 7-bit registers (305*a–f*, where 305*c–e* are illustrated by the dotted lines) as discussed with respect to the Table 1. The multiplexer 304 receives two input signals 306 and 308. As illustrated in FIG. 3, in a loop mode, the signal 308 may be fed back to the register 305*a* through the multiplexer 304 (via, for example, a 2-bit wide path 310), whereas, in a non-loop mode, the signal 306 may be fed back to the register 305*a* through the multiplexer 304. In one embodiment, the seven bits of each instruction can be shifted in parallel in the instruction register 300 (e.g., as a circular FIFO). For example, in one embodiment, the March element field of the register 305*f* (Instruction 1) may be fed back into that of the register 305*a* (Instruction 6) through the multiplexer 304 (via, for example, a 2-bit wide path 310), so that when the loop signal 302 is not set, a "00" vector (as signal 306) is automatically loaded into the register 305*a* (Instruction 6) indicating completion of the six instruction March test.

In an embodiment, an address step size register (not shown) can be utilized to program the step size associated with the addresses. The address step size may be coupled with the address incrementer/decrementer for generating the test address. The address step size register may be programmable through a 3-bit step size register that allows address steps of 4, 8, 16, 32, 64, 128, or 512 bits. In an embodiment, the EBIST implementation described herein may send requests to the external RAM in bursts of four addresses in each transaction with the memory. This may be a restriction of the existing external memory controller. This feature allows the user to reduce test time, if needed, at the expense of some loss of test coverage. This is especially useful in production test flows where a full EBIST test is run at a first test step and a smaller test is run at subsequent test steps. The step size information may be sent to an address generator (such as 206 of FIG. 2) as well as a data generator (such as 204 of FIG. 2) to effect proper control of write and read operations to the memory.

In one embodiment, the address generator (such as 206 of FIG. 2) can be an ordinary up-down counter that takes inputs from the step size register and the instruction register (specifically its increment/decrement bit), such as that discussed with respect to FIG. 3. For the address uniqueness test purpose, the address generator may send the current address to the data generator. For start and end addresses, a user may program a specific start address and an end address used by the address generator as first and last addresses, respectively. This feature may be another way to reduce test time. One of its uses may be in debug where the user may need to narrow down the search for a failing address to within a range, for example. This address range may be specified using a start and an end address. Another use of this feature may be during verification where it would be infeasible to simulate EBIST operations running through a relatively large (e.g., 16 GB) address space. For example, in the case of a 16-GB memory with a 30-bit address bus, simulation of EBIST for the full address space at the gate level can result in simulation times in the range of weeks. By programming the address space, one may be able to target corner cases and run regressions with reasonable simulation times (e.g., reducing simulation time from weeks to less than an hour).

In a further embodiment, the data generator (such as 204 of FIG. 2) can include two main functions: (1) generating data that is written to the memory in write mode; and (2) comparing the data read from the memory with the expected data in read mode. In addition, some debug capabilities may be also implemented in the data generator such as: (a) dump on error; (b) dump on address; and (c) an error counter. Such additional features may be helpful, especially as the size of the memory circuits increase.

In another embodiment, a data background register (not shown) can be coupled to an IEEE 1149.1 standard interface for programming (i.e., input) and connect to the output data of the BIST module. The data background register may hold the bit vector (or its inversion) that is written into the memory by the test algorithm. The width of the data background register can be the same as the data width of the memory, in an embodiment. This value may also be used as expected data for comparison with data read from the memory. The data background can be programmable through the IEEE 1149.1 standard interface. This permits the user to perform March and checkerboard test algorithms with different data backgrounds to ensure relatively high test coverage of the external memory.

In yet another embodiment, either (or both) of two debug capabilities can be implemented inside the data generator (such as 204 of FIG. 2), namely, a dump-on-error and dump-on-address. The data generator may include three registers to implement the two modes in one embodiment. In an embodiment, an error counter may be utilized. The error counter can be initialized to, for example, "0" at the beginning of an EBIST run and then incremented whenever an error is detected. In an embodiment of the present invention, the dump-on-error register may be implemented as a 5-bit register that can be programmed (e.g., through the IEEE 1149.1 standard interface) with an integer up to 31, for example. If the error counter value becomes equal to the value of the dump-on-error register, the failing address and the failing data may be captured into copy (or shadow) register(s). At the end of the test run, the contents of the copy registers may be shifted out through, for example, the IEEE 1149.1 standard interface.

Moreover, in an embodiment of the present invention, a dump-on-address register may be programmed to contain a specific address. Whenever the read address becomes equal to the one stored by the dump-on-address register, the content of the failing address and the failing data may be captured into copy (shadow) register(s). The stored data can subsequently be shifted out at the end of the test session. In one embodiment, only one of the two debug capabilities can be active at any time. For example, the built-in priority may allow the dump-on-address function to be active only when the dump-on-error register is set to "0" or inactive. These two modes may be used either to perform a fail address man or to debug the memory controller and/or EBIST interface.

Furthermore, in an embodiment, the data generator may have one or more of two operation modes, such as a standard mode and an address uniqueness mode. In the standard mode, during a write sequence, the data generator may use the inversion bits (e.g., bits 2–4, see Table 1) of the active instruction sent by a controller (such as 202 of FIG. 2) to determine whether to write the stored data background or its inversion. For a read operation, the data generator may use a "data valid" signal, for example, sent by a memory controller, to decide when to perform a compare. The data generator may provide the expected data as well as the data received from the memory to a comparator. The comparator may receive as inputs the read data from the memory and the expected value. The comparator's output may be provided as an output of the IC and/or stored in a register (for example, for future retrieval). In an embodiment, the comparator may reside within the data generator. In the event of an error, the comparator may send a signal to a primary output that is held at that value for a certain number of clock cycles to satisfy the CPU/system clock ratio. The output of the comparator may also be used to increment an error counter that can be shifted out at the end of the test sequence, for example.

The address uniqueness mode may implement a 2N test, in one embodiment, where:

1. In a first pass through the address space a unique bit vector is written into each location of the memory. The data generator may accomplish this by taking the current address from the address generator and replicating it to fit the data width.
2. In a second pass, a "data valid" signal may be used to control a counter that is initialized to the first written address location (e.g., in step 1 above). The counter may then keep track of subsequent data received from the memory by incrementing its contents. The counter may also replicate the read unique data (in this case the address) to fit the data width.

In one embodiment, when the chip comes out of a reset, the default state of the EBIST controller can be setup to perform a March C test with the full address range and the background set to a All-0 pattern.

To program a simple March C test, five of the six instruction registers (such as those of FIG. 3) may be used as shown in Table 2 below.

TABLE 2

Instruction Sequences for a March 13N Test

| Register | March Element | Inv | I/D | U |
|---|---|---|---|---|
| Register 1 | 10 | 000 | 0 | 0 |
| Register 2 | 11 | 011 | 0 | 0 |
| Register 3 | 11 | 100 | 1 | 0 |
| Register 4 | 11 | 011 | 1 | 0 |
| Register 5 | 11 | 100 | 0 | 0 |

This kind of programmability is also useful for initializing the contents of the memory. In such a case, it may only be necessary to use the first register.

To program a simple test sequence, the sequence of instructions shown in Table 3 may be utilized (which performs an address uniqueness test followed by a 10N March test).

TABLE 3

Alternative Sequence of Instructions Defining a 12N Test of the Memory

| Register | March Element | Inv | I/D | U |
|---|---|---|---|---|
| Register 1 | 10 | XXX | 0 | 1 |
| Register 2 | 01 | XXX | 0 | 1 |

TABLE 3-continued

Alternative Sequence of Instructions Defining a 12N Test of the Memory

| Register | March Element | Inv | I/D | U |
|---|---|---|---|---|
| Register 3 | 10 | 000 | 0 | 0 |
| Register 4 | 11 | 011 | 0 | 0 |
| Register 5 | 11 | 100 | 1 | 0 |
| Register 6 | 11 | 011 | 1 | 0 |

In one embodiment, the implementation of the EBIST engine (such as 200 of FIG. 2) may be done for a processor or application-specific IC (ASIC), available for example from Sun Microsystems, Inc., of Santa Clara, Calif. The control block may be synthesized using Synopsys' Design Compiler. The place and route may be done using Cadence's SiliconEnsemble. The area of the controller may reach about 1350μ×147μ for a 0.15μ technology. The address generator and data generator may be constructed as data paths using an appropriate placement tool and Cadence's ICCraftsman router, for example. The address block size may reach about 825μ×463μ and the data block may reach about 1369μ×1456μ for a 0.15μ technology.

Accordingly, in an embodiment, an implementation of an instruction-based on-chip BIST engine for testing external memories/caches has been presented. The proposed scheme offers high quality tests along with a significant level of flexibility for board level and system level test and debug of external memories. Some of the goals achieved by various embodiments of the present invention, individually or in combination, include, but are not limited to: enabling at-speed and high coverage testing of external memories, reducing test costs by reducing the test fixture capital, reducing test costs by allowing test at an earlier stage, reducing test costs by reducing test time by a factor of about ten compared to conventional POST programs used today, reducing test costs by increasing the reliability of measurements compared to that of conventional POST, significantly improving debug capabilities for failures detected in the memory subsystem, providing an adaptable environment for test (e.g., the test sequence can be programmed depending of the memory vendor and customer requirement), and/or minimizing the impact on the existing design by reusing features of the memory controller engine and/or by leaving the critical paths untouched.

The foregoing description has been directed to specific embodiments. It will be apparent to those with ordinary skill in the art that modifications may be made to the described embodiments, with the attainment of all or some of the advantages. For example, the techniques of the present invention may be applied to very large-scale integrated (VLSI) logic and/or circuit modules. In addition, any type of memory may be tested in accordance with various embodiments of the present invention regardless of the memory's logic, organization, and/or structure, for example. Therefore, it is the object of the appended claims to cover all such variations and modifications as come within the spirit and scope of the invention.

What is claimed is:

1. A built-in self-testing system comprising:
   an external memory module;
   an on-chip memory controller coupled to the external memory module, the on-chip memory controller sending and receiving data to and from the external memory module;

an on-chip built-in self-test (BIST) module coupled to the on-chip memory controller, the BIST module including an instruction register to store a plurality of instructions; and a multiplexer coupled to the instruction register to permit loop tests;

an interface controller coupled to the BIST module to provide an interface to access the BIST module, wherein the BIST module utilizes the on-chip memory controller to perform tests on the external memory module.

2. The system of claim 1 wherein the interface controller is provided in compliance with IEEE 1149.1 standard.

3. The system of claim 1 further including an I/O interface coupled between the on-chip memory controller and the external memory module to provide communication between the on-chip memory controller and the external memory module.

4. The system of claim 1 wherein the instruction register includes at least six 7-bit registers.

5. The system of claim 1 wherein the instructions have an opcode selected from a group comprising March element, inversion, increment/decrement address, and address uniqueness.

6. The system of claim 1 wherein the BIST module is implemented inside a CPU.

7. The system of claim 6 wherein the CPU may be selected from a group comprising CISC, VLIW, and RISC processors.

8. The system of claim 1 wherein the BIST module includes a controller, a data generator, and an address generator.

9. The system of claim 8 wherein the data generator has a debug capability implemented selected from a group comprising a dump-on-error and dump-on-address.

10. The system of claim 8 wherein the data generator further includes a comparator to compare expected data and data received from the external memory module.

11. The system of claim 1 further including an address step-size register to allow relatively quicker screening of the external memory module.

12. The system of claim 1 wherein addresses selected from a group comprising start and end addresses may be programmed through the BIST module.

13. A method of utilizing a built-in self-testing system, the method comprising:

providing an external memory module;

providing an on-chip memory controller coupled to the external memory module, the on-chip memory controller sending and receiving data to and from the external memory module;

providing an on-chip built-in self-test (BIST) module coupled to the on-chip memory controller, the BIST module including an instruction register to store a plurality of instructions; and coupling a multiplexer to the instruction register to permit loop tests;

coupling an interface controller to the BIST module to provide an interface to access the BIST module, wherein the BIST module utilizes the on-chip memory controller to perform tests on the external memory module.

14. The method of claim 13 wherein the interface controller is compliant with IEEE 1149.1 standard.

15. The method of claim 13 further including coupling an I/O interface between the on-chip memory controller and the external memory module to provide communication between the on-chip memory controller and the external memory module.

16. The method of claim 13 wherein the instruction register includes at least six 7-bit registers.

17. The method of claim 13 wherein the BIST module is implemented inside a CPU.

18. The method of claim 13 wherein the BIST module includes a controller, a data generator, and an address generator.

19. The method of claim 18 wherein the data generator provides a debug capability by utilizing a solution selected from a group comprising a dump-on-error and dump-on-address.

20. The method of claim 13 wherein the data generator further includes a comparator to compare expected data and data received from the external memory module.

21. The method of claim 13 wherein addresses selected from a group comprising start and end addresses may be programmed through the BIST module.

22. A built-in self-testing system comprising:

an external memory module;

an on-chip memory controlling means for sending and receiving data to and from the external memory module;

an on-chip built-in self-test (BIST) means;

a multiplexer coupled to the BIST means to permit loop tests; and a standard interface controlling means for providing an interface to access the BIST means.

23. The system of claim 22 further including an I/O interface means for providing communication between the on-chip memory controlling means and the external memory module.

* * * * *